United States Patent
Liang et al.

(10) Patent No.: US 12,310,174 B2
(45) Date of Patent: May 20, 2025

(54) DISPLAY DEVICE, DISPLAY SUBSTRATE AND MANUFACTURING METHOD OF DISPLAY SUBSTRATE

(71) Applicant: KunShan Go-Visionox Opto-Electronics Co., Ltd., Jiangsu (CN)

(72) Inventors: Chao Liang, Kunshan (CN); Hao Wu, Kunshan (CN); Shuaijie Chi, Kunshan (CN); Jingsong Tang, Kunshan (CN); Junhui Lou, Kunshan (CN); Guosheng Tao, Kunshan (CN); Jun Fan, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 657 days.

(21) Appl. No.: 17/362,095

(22) Filed: Jun. 29, 2021

(65) Prior Publication Data

US 2021/0335940 A1 Oct. 28, 2021

Related U.S. Application Data

(63) Continuation of application No. PCT/CN2020/075314, filed on Feb. 14, 2020.

(30) Foreign Application Priority Data

Jun. 10, 2019 (CN) .......................... 201910498035.5

(51) Int. Cl.
*H01L 27/32* (2006.01)
*H10K 59/121* (2023.01)
(Continued)

(52) U.S. Cl.
CPC ......... *H10K 59/121* (2023.02); *H10K 59/122* (2023.02); *H10K 59/353* (2023.02);
(Continued)

(58) Field of Classification Search
CPC .... H10K 59/122; H10K 59/353; H10K 59/60; H10K 59/1201; H10K 71/00
(Continued)

(56) References Cited

U.S. PATENT DOCUMENTS 6,791,261 B1 * 9/2004 Shimoda ................ H10K 59/35
313/506
RE43,759 E 10/2012 Shimoda et al.
(Continued)

FOREIGN PATENT DOCUMENTS

CN 1367938 A 9/2002
CN 104978066 A 10/2015
(Continued)

OTHER PUBLICATIONS

English Machine Translation of CN108389879. (Year: 2018).*
(Continued)

*Primary Examiner* — Dzung Tran
(74) *Attorney, Agent, or Firm* — Maier & Maier, PLLC

(57) ABSTRACT

A display device, a display substrate, and a manufacturing method of the display substrate. The display substrate includes a display region. The display region includes a transparent display region, and the transparent display region includes a first base and a plurality of first sub-pixels on the first base. Each of the first sub-pixels includes: a first electrode; a first pixel-defining layer disposed on the first electrode, the first-pixel defining layer being provided with an opening; a first light-emitting material layer disposed in the opening of the pixel-defining layer; and a second electrode disposed on the first light-emitting material layer.

(Continued)

Further, a plurality of isolation pillars are provided on the first pixel-defining layer and configured to separate the second electrodes of adjacent first sub-pixels, the isolation pillar is T-shaped, and the isolation pillar is an integrally formed structure.

14 Claims, 7 Drawing Sheets

(51) Int. Cl.
  *H10K 59/122* (2023.01)
  *H10K 59/35* (2023.01)
  *H10K 59/60* (2023.01)
  *H10K 59/80* (2023.01)
  *H10K 71/00* (2023.01)
  *H10K 59/12* (2023.01)

(52) U.S. Cl.
  CPC ....... *H10K 59/60* (2023.02); *H10K 59/80521* (2023.02); *H10K 71/00* (2023.02); *H10K 59/1201* (2023.02)

(58) Field of Classification Search
  USPC .......................................................... 257/40
  See application file for complete search history.

(56) References Cited

U.S. PATENT DOCUMENTS

| | | | |
|---|---|---|---|
| RE44,164 E | | 4/2013 | Shimoda et al. |
| RE45,442 E | | 3/2015 | Shimoda et al. |
| 2014/0183479 A1* | | 7/2014 | Park .................. H10K 59/1315 438/34 |
| 2014/0183501 A1* | | 7/2014 | Kim .................. H10K 59/1315 438/34 |
| 2014/0312323 A1* | | 10/2014 | Park .................. H10K 59/1315 438/23 |
| 2016/0149156 A1* | | 5/2016 | Kim .................. H10K 59/121 438/46 |
| 2016/0162096 A1* | | 6/2016 | Hao .................. H10K 59/1213 345/174 |
| 2019/0058020 A1* | | 2/2019 | Tsai .................. G06F 3/0412 |

FOREIGN PATENT DOCUMENTS

| | | |
|---|---|---|
| CN | 105633297 A | 6/2016 |
| CN | 108389879 A | 8/2018 |
| CN | 109004106 A | 12/2018 |
| CN | 109509781 A | 3/2019 |
| CN | 110767721 A | 2/2020 |
| KR | 1020030062033 A | 7/2003 |

OTHER PUBLICATIONS

English Machine Translation of KR20030062033. (Year: 2003).*
State Intellectual Property Office of the People's Republic of China, Office Action and Search Report Issued in Application No. 2019104980355, May 13, 2020, 18 pages. (Submitted with Machine/Partial Translation).
State Intellectual Property Office of the People's Republic of China, Office Action and Search Report Issued in Application No. 2019104980355, Aug. 12, 2020, 15 pages. (Submitted with Machine/Partial Translation).
ISA State Intellectual Property Office of the People's Republic of China, International Search Report Issued in Application No. PCT/CN2020/075314, May 20, 2020, WIPO, 4 pages.
ISA State Intellectual Property Office of the People's Republic of China, Written Opinion of the International Searching Authority Issued in Application No. PCT/CN2020/075314, May 20, 2020, WIPO, 8 pages. (Submitted with Machine/Partial Translation).

* cited by examiner

DISPLAY DEVICE, DISPLAY SUBSTRATE AND MANUFACTURING METHOD OF DISPLAY SUBSTRATE

CROSS-REFERENCE TO RELATED APPLICATIONS

The present application is a continuation application of International Application No. PCT/CN2020/075314 filed on Feb. 14, 2020, which claims priority to Chinese Patent Application No. 201910498035.5, filed on Jun. 10, 2019, both of which are hereby incorporated by reference in their entireties.

TECHNICAL FIELD

This application relates to a technical field of display device, and in particular to a display device, a display substrate, and a manufacturing method of the display substrate.

BACKGROUND

With a rapid development of display device, users have higher and higher requirements for a screen-to-body ratio, such that a full-screen display of the electronic device has attached more and more attention in the industry. An electronic device such as a mobile phone or a tablet computer needs to have a front camera, an earpiece, an infrared sensor, and the like integrated therein. A notch or hole may be provided in a display screen, and the camera, the earpiece, the infrared sensor and the like may be disposed in an area of the notch or hole in the display screen. However, the area of the notch or hole in the display screen cannot be used to display image. Such an electronic device does not have a full screen in the true sense, and cannot display images in all areas of the entire display screen. For example, the area of "notch" of iPhone X, which affects the overall consistency of the screen.

SUMMARY

The objective of the present application is to provide a display device for a full screen display, a display substrate, and a manufacturing method of the display substrate.

In order to achieve the above objective, according to a first aspect of the present disclosure, a display substrate is provided. The display substrate includes a display region. The display region includes a transparent display region. The transparent display region includes: a first base and a plurality of first sub-pixels on the first base. Each of the plurality of first sub-pixels includes: a first electrode; a first pixel-defining layer disposed on the first electrode, and the first pixel-defining layer being provided with an opening; a first light-transmitting material layer disposed in the opening of the pixel-defining layer; and a second electrode disposed on the first light-transmitting material layer. Wherein a plurality of isolation pillars are provided on the first pixel-defining layer and configured to separate the second electrodes of adjacent first sub-pixels, the isolation pillar is T-shaped, and the isolation pillar is an integrally formed structure.

According to a second aspect of the present disclosure, a display device is provided. The display device includes: a device body with a component region, a display panel covering the device body; the display panel includes the above-mentioned display substrate, wherein the component region is disposed below the transparent display region of the display substrate, and a photosensitive component that emits or collects light through the transparent display region is arranged in the component region.

According to a third aspect of the present disclosure, a manufacturing method of the display substrate is provided. The display substrate includes a display region, The method includes: providing a light-transmitting base, the light-transmitting base includes a portion configured to form the display region, the portion includes a first region, the first region is divided into a plurality of first sub-regions; forming a plurality of pixel electrodes on the light-transmitting base, and the pixel electrodes include a plurality of first electrodes formed in the first sub-regions with one-to-one correspondence; forming a pixel-defining layer on the light-transmitting base, and the pixel-defining layer includes a first pixel-defining layer formed on the plurality of first electrodes and the first region not covered by the plurality of first electrodes, wherein a plurality of openings are provided in the first pixel-defining layer, and each of the plurality of openings exposes one of the first electrodes; forming a sacrificial layer on the first pixel-defining layer and the plurality of first electrodes; patterning the sacrificial layer to form a plurality of filling-openings, each of the plurality of filling-openings exposes the first pixel-defining layer between adjacent first sub-regions; forming an isolation pillar material layer in each of the plurality of filling-openings and on the sacrificial layer located outside of each of the plurality of filling-openings; patterning the isolation pillar material layer to form a plurality of T-shaped isolation pillars, and each T-shaped isolation pillar is disposed between adjacent first sub-regions; removing the patterned sacrificial layer; forming a light-emitting material layer on the pixel electrodes, the light-emitting material layer includes a first light-emitting material layer formed on the exposed first electrodes; vapor-depositing a conductive material layer, the conductive material layer after vapor deposition includes a plurality of second electrodes separated by the T-shaped isolation pillars.

The beneficial effects of this application are:

Compared to isolation pillar of other shapes such as rectangle, regular trapezoid, and inverted trapezoid, the T-shaped isolation pillar has a better partition effect on a conductive material layer for vapor deposition. In addition, the T-shaped isolation pillar is an integrally formed structure. In other words, the T-shaped isolation pillar is a single layer structure of a same material, and the T-shaped isolation pillar may be formed by a same patterned process, so that the T-shaped isolation pillar has no delamination phenomenon and has reliable performance.

DETAILED DESCRIPTION OF THE EMBODIMENTS

In order to make the above objectives, features and advantages of the present application more apparent and understandable, specific implementations of the present application will be described in detail below with reference to the drawings.

In this application, "transverse direction" refers to a direction in the plane where a light-transmitting base is disposed, and "longitudinal direction" refers to a direction of the thickness of the light-transmitting base.

The present application provides a display substrate including a display region. The display region includes a transparent display region, and the transparent display region includes a first base and a plurality of first sub-pixels disposed on the first base, and the first base is a light-transmitting base. Each of the first sub-pixels includes: a first electrode; a first pixel-defining layer disposed on the first electrode, the first pixel-defining layer being provided with an opening; a first light-emitting material layer disposed in the opening of the first pixel-defining layer; and a second electrode disposed on the first light-emitting material layer. The transparent display region includes an isolation pillar disposed on the first pixel-defining layer, the isolation pillar is configured to separate the second electrodes of adjacent first sub-pixels, for example, separate the second electrodes of two adjacent first sub-pixels. The isolation pillar is T-shaped, and the T-shaped isolation pillar is an integrally formed structure. In this way, compared to isolation pillar of other shapes such as rectangle, regular trapezoid, and inverted trapezoid, the T-shaped isolation pillar has a better automatic partition effect on a conductive material layer for vapor deposition. In addition, the T-shaped isolation pillar is an integrally formed structure. In other words, the T-shaped isolation pillar is a single layer structure, the T-shaped isolation pillar is made of a same material and may be patterned in a same process, so that the T-shaped isolation pillar has no delamination phenomenon and has a reliable performance.

Figure 1:
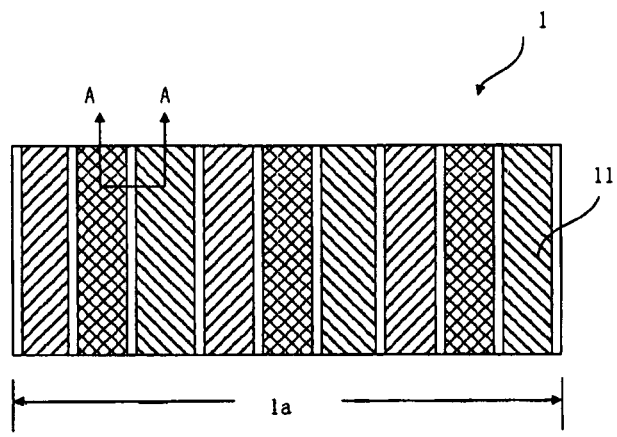
FIG. 1 is a top view of a display substrate corresponding to a transparent display region in an embodiment of the present application.
Figure 2A:
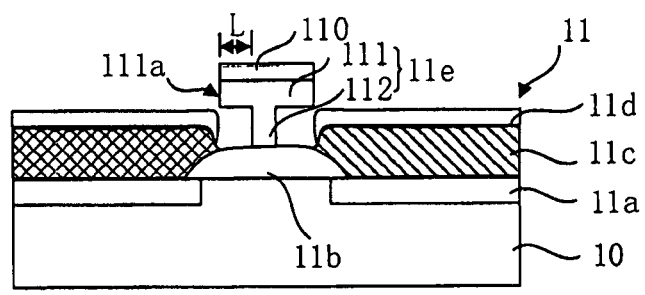
FIG. 2(a) is a cross-sectional view taken along line AA in FIG. 1.
Figure 2B:
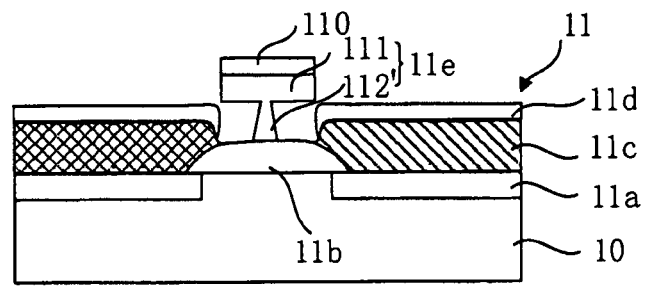
FIG. 2(b) is a schematic diagram of a variant structure of a T-shaped isolation pillar in FIG. 2(a)
Figure 2C:
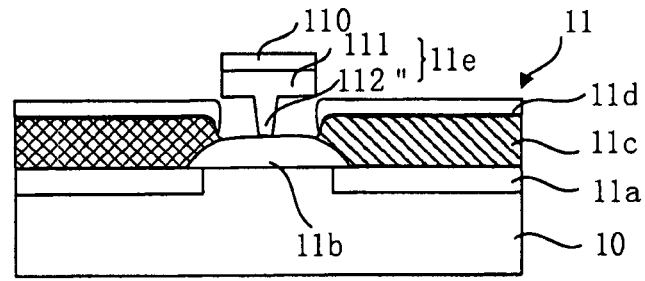
FIG. 2(c) is another schematic diagram of a variant structure of a T-shaped isolation pillar in FIG. 2(a)

Referring to FIG. 1 and FIG. 2(c), the display substrate 1 includes a transparent display region 1a, and the transparent display region 1a includes: a first base 10 and a plurality of first sub-pixels 11 disposed on the first base 10. Each of the first sub-pixels 11 includes a first electrode 11a, a first pixel-defining layer 11b disposed on the first electrode 11a, a first light-emitting material layer 11c disposed in an opening of the first pixel-defining layer 11b, and a second electrode 11d disposed on the first light-emitting material layer 11c. The transparent display region includes an isolation pillar disposed on the first pixel-defining layer 11b, the isolation pillar 11e is configured to separate the second electrodes 11d of adjacent first sub-pixels 11. The isolation pillar 11e is T-shaped, and the T-shaped isolation pillar 11e is an integrally formed structure.

The first base 10 may be a flexible base or a rigid base. The material of the flexible base may be polyimide, and the material of the rigid base may be glass.

The first electrode 11a may be a light-transmitting anode. The second electrode 11d may be a cathode. The first light-emitting material layer 11c may be an OLED (Organic Light-Emitting Diode) layer.

When a driving voltage is applied between the first electrode 11a and the second electrode 11d of each first sub-pixel 11, the transparent display region 1a performs a display function. When no driving voltage is applied between the first electrode 11a and the second electrode 11d of each first sub-pixel 11, the transparent display region 1a performs a light transmission function.

In FIG. 1, the first electrodes 11a and the second electrodes 11d are arranged in one row with a plurality of columns. In other optional embodiments, the first electrodes 11a and the second electrodes 11d may also be arranged in one column with a plurality of rows or in a plurality of rows with a plurality of columns. Compared with the first sub-pixels 11 arranged in a plurality of rows with a plurality of columns, the first sub-pixels 11 arranged in one row with a plurality of columns or in one column with a plurality of rows can simplify the film structure of the transparent display region 1a, and reduce the diffraction phenomenon in the transparent display region 1a, and improve the display effect.

The first sub-pixel 11 may be driven by AM (Active Matrix) driving mode or PM (Passive Matrix) driving mode. In the AM driving mode, a pixel driving circuit is provided between the first electrodes 11a and the first base 10, the pixel driving circuit provides a data signal voltage to each of the first electrodes 11a. In the PM driving mode, a data signal voltage of each of the first electrodes 11a comes from a data signal channel of the Display Driver IC (DDIC for short). When the first sub-pixels 11 are driven by the PM driving mode, the first electrodes 11a are arranged in one row with a plurality of columns, and the isolation pillars 11e are arranged in one row with a plurality of columns; or the first electrodes 11a are arranged in one column with a plurality of rows, and the isolation pillars 11e are arranged in one column with a plurality of rows.

Referring to FIG. 2(a), the T-shaped isolation pillar 11e includes a partition portion 111 extending in a transverse direction (for example, the row direction) and a support portion 112 configured to support the partition portion 111. The support portion 112 is disposed on the first pixel-defining layer 11b. The partition portion 111 includes partition ends 111a, for example, the partition ends 111a are ends of the partition portion 111 in the extending direction thereof. The greater the minimum distance L between the partition end 111a and the support portion 112 is, the better the automatic partition effect on the conductive material layer 110 for vapor deposition can be. The minimum distance L is, for example, the distance between the partition end 111a and the support portion 112 in a direction parallel to the extending direction of the partition portion. In an embodiment, the distance L is greater than 1 μm. However, the larger the minimum distance L between the partition end 111a and the support portion 112 is, the smaller the sizes of the first light-emitting material layer 11c and the second electrode 11d are, and the smaller the effective light-emitting area is, that is, the smaller the opening rate is.

In addition, in an embodiment, a top end of the support portion 112 is higher than an upper surface of the second electrode 11d to ensure that the second electrodes 11d of the adjacent first sub-pixels 11 are separated by the T-shaped isolation pillar 11e. In an optional embodiment, the height of the support portion 112 is greater than 550 nm.

Referring to FIG. 2(a), the longitudinal section of the support portion 112 may be rectangular. In addition, the support portion may be a support portion 112' with a regular trapezoidal longitudinal section as shown in FIG. 2(b), or a support portion 112" with an inverted trapezoidal longitudinal section as shown in FIG. 2(c). The present application does not limit the specific shape of the longitudinal section of the support portion. The term "longitudinal section" used herein refers to the surface formed by cutting along the thickness direction of the display substrate.

In addition, a material of the T-shaped isolation pillar 11e can be an inorganic transparent material or an organic transparent material. The inorganic transparent material or the organic transparent material does not affect the light transmittance of the transparent display region.

In FIG. 1, the transparent display region 1a is rectangular. In other embodiments, the transparent display region 1a may be drop-shaped, circular, oval, or notch-shaped.

The present application also provides a manufacturing method of a display substrate 3 described below.

Figure 3:
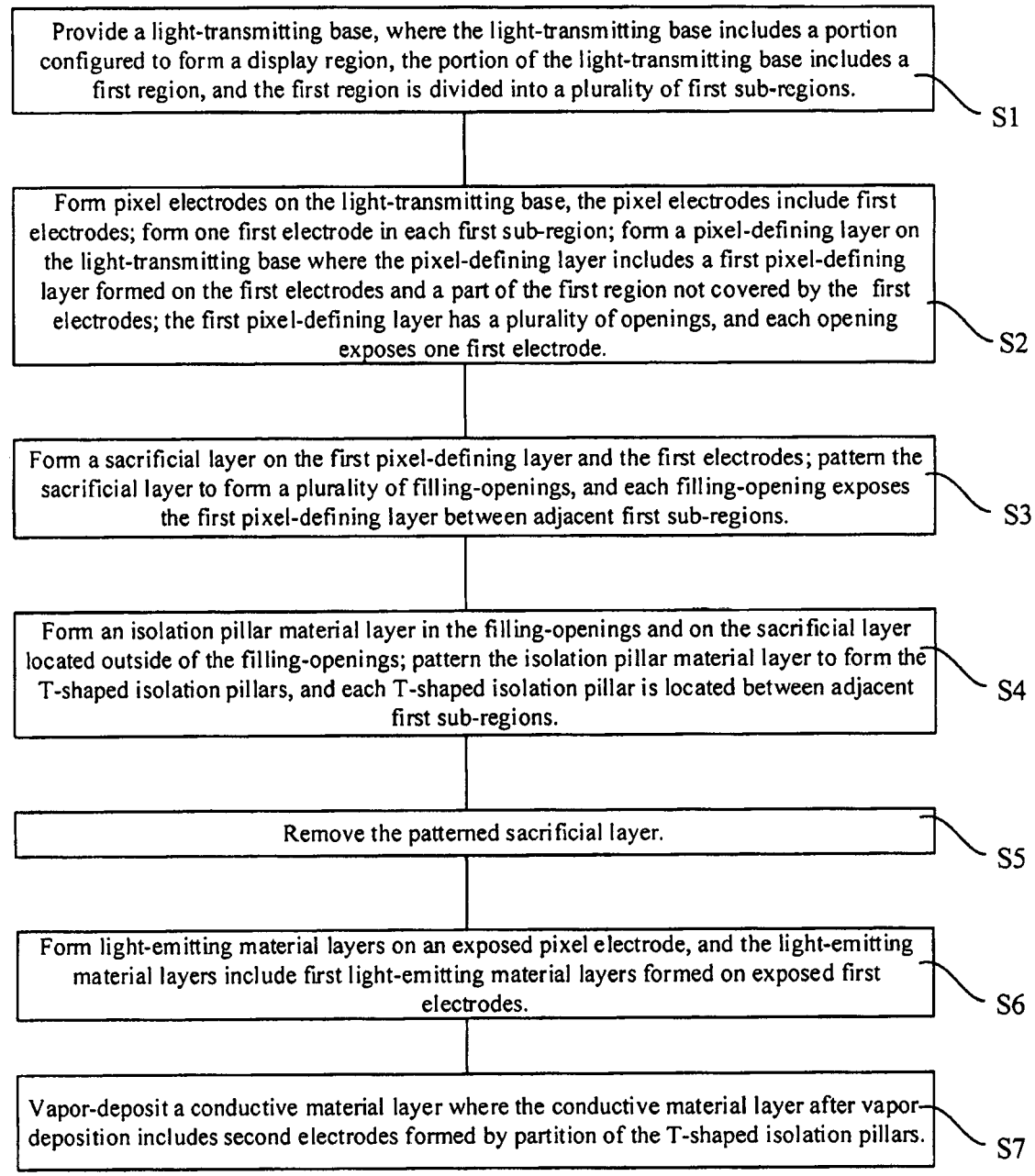
FIG. 3 is a flowchart showing a manufacturing method of the display substrate according to an embodiment of the present application.
Figure 4:
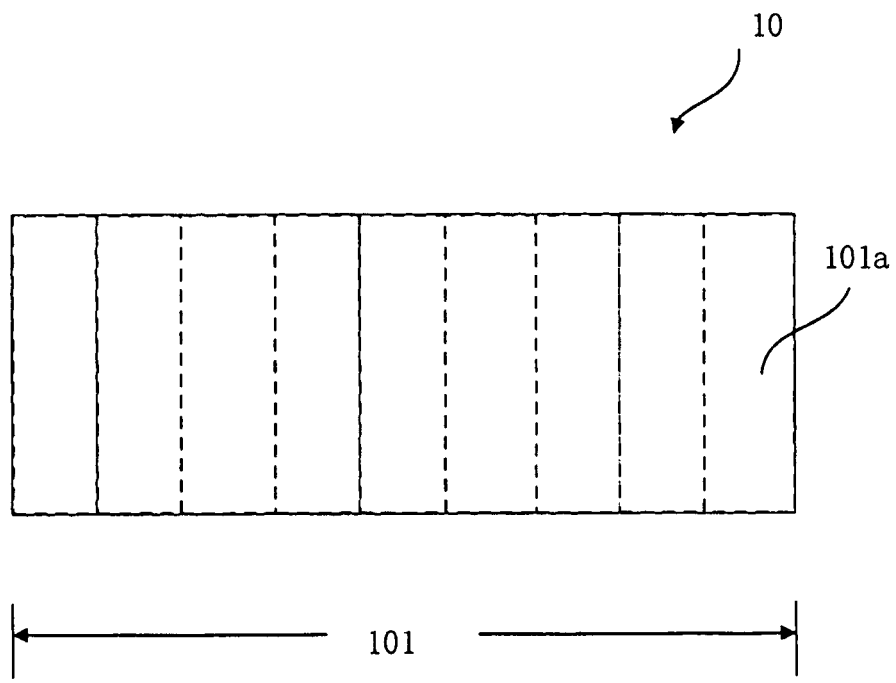
FIG. 4 is a schematic diagram of an intermediate structures corresponding to the flowchart in FIG. 3.

First, referring to step S1 in FIG. 3 and FIG. 4, a light-transmitting base is provided. The light-transmitting base includes a portion configured to form a display region, this portion of the light-transmitting base includes a first region 101, and the first region 101 is divided into a plurality of first sub-regions 101a.

The light-transmitting base may be a flexible base or a rigid base. The material of the flexible base may be polyimide, and the material of the rigid base may be glass.

The position and scope of the first region 101 is corresponding to the transparent display region 1a (see FIG. 1). One first sub-region 101a is corresponding to one first sub-pixel 11.

Figure 5:
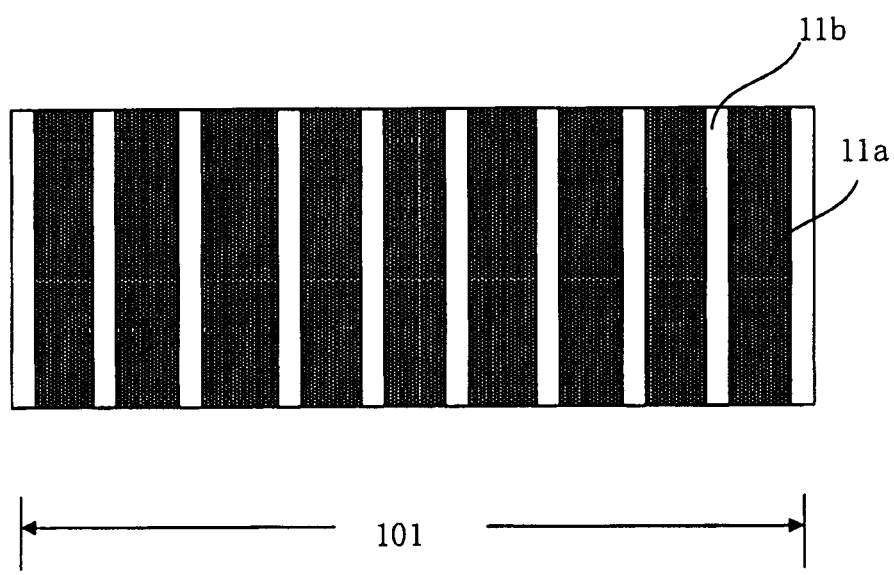
FIG. 5 is a schematic diagram of an intermediate structures corresponding to the flowchart in FIG. 3.

Then, referring to step S2 in FIG. 3 and FIG. 5, pixel electrodes are formed on the light-transmitting base. The pixel electrodes include first electrodes 11a, and one first electrode 11a is formed in each first sub-region 101a. A pixel-defining layer is formed on the light-transmitting base. The pixel-defining layer includes a first pixel-defining layer 11b formed on the first electrodes 11a and the first region 101 not covered by the first electrodes 11a. The first pixel-defining layer 11b has a plurality of openings, and each opening exposes one first electrode 11a.

The material of the first electrode 11a may be ITO. The first pixel-defining layer 11b can be made of inorganic or organic materials, such as silicon dioxide, silicon nitride, or polyimide. The corresponding openings formed in the first pixel-defining layer may be formed by dry etching or formed by a photo etching process.

Figure 6:
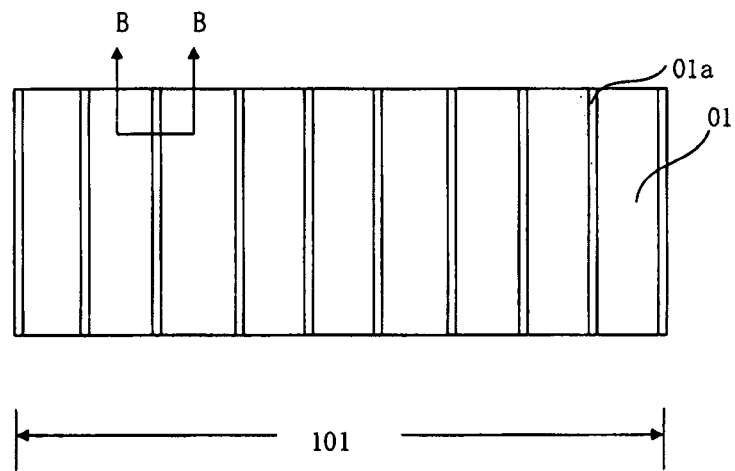
FIG. 6 is a schematic diagram of an intermediate structures corresponding to the flowchart in FIG. 3.
Figure 7:
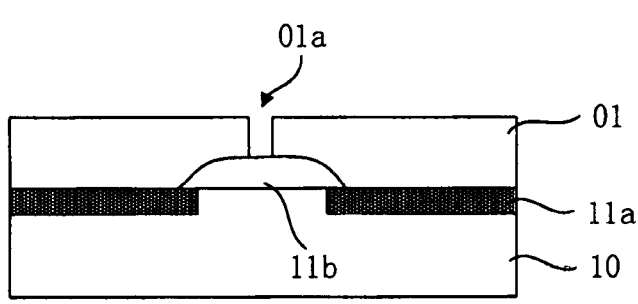
FIG. 7 is a schematic diagram of an intermediate structures corresponding to the flowchart in FIG. 3.

Then, referring to step S3 in FIG. 3 as well as FIGS. 6 and 7, a sacrificial layer 01 is formed on the first pixel-defining layer 11b and the first electrodes 11a. The sacrificial layer 01 is patterned to form a plurality of filling-openings 01a, and each filling-opening 01a exposes the first pixel-defining layer 11b between adjacent first sub-regions 101a. FIG. 7 is a cross-sectional view taken along line BB in FIG. 6.

The material of the sacrificial layer 01 may be ITO and/or IGZO. Alternatively, the material of the sacrificial layer 01 may be metallic molybdenum or a photosensitive material, such as positive photoresist or negative photoresist. The sacrificial layer 01 made of inorganic ITO, IGZO, or metallic molybdenum can be formed by physical vapor-deposition or chemical vapor-deposition and the filling-opening 01a is formed in the sacrificial layer 01 by photo etching, dry etching or wet etching. The sacrificial layer 01 made of organic photosensitive materials can be formed by curing the coating liquid photoresist and the filling-opening 01a of the sacrificial layer is formed by photo etching.

Figure 8:
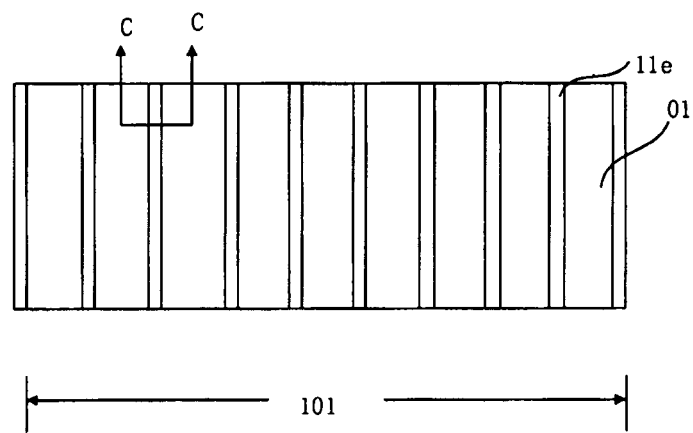
FIG. 8 is a schematic diagram of an intermediate structures corresponding to the flowchart in FIG. 3.
Figure 9:
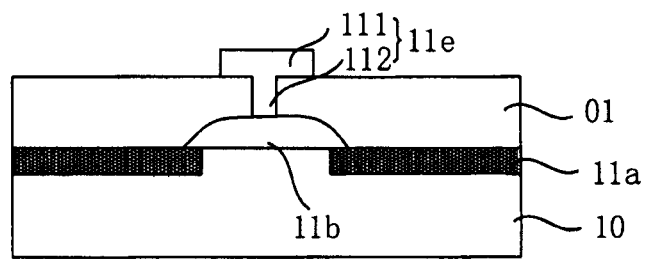
FIG. 9 is a schematic diagram of an intermediate structures corresponding to the flowchart in FIG. 3.

Then, referring to step S4 in FIG. 3 as well as FIG. 8 and FIG. 9, an isolation pillar material layer is formed in the filling-openings 01a and on the sacrificial layer 01 located outside of the filling-openings 01a. The isolation pillar material layer is patterned to form the T-shaped isolation pillars 11e, and each T-shaped isolation pillar 11e is disposed between adjacent first sub-regions 101a. FIG. 9 is a cross-sectional view taken along line CC in FIG. 8.

It can be seen that, after patterning, the isolation pillar material layer in the filling-openings 01a forms the support portions 112, and the isolation pillar material layer located on the sacrificial layer 01 and located outside of the filling-openings 01a forms the partition portions 111.

The isolation pillar material layer can be made of inorganic transparent material or organic transparent material. The material of the isolation pillar material layer is different from that of the sacrificial layer 01.

When the isolation pillar material layer is made of inorganic transparent material, the material may be silicon dioxide, silicon nitride, or the like. Each isolation pillar 11e may be formed by photo etching, dry etching, or wet etching.

When the isolation pillar material layer is made of organic transparent material, the material may be organic transparent adhesive. The organic transparent adhesive is obtained by curing liquid organic materials, and the liquid organic materials have strong fluidity and good filling effect, so the filling effect of organic transparent adhesive is also good. Alternatively, the isolation pillar material layer is made of an organic transparent non-photosensitive material.

In an embodiment, the organic transparent adhesive is photosensitive adhesive. The photosensitive adhesive may be a positive photoresist or a negative photoresist. The photosensitive adhesive can be coated first, then baked and cured. The patterning of the photosensitive adhesive is relatively simple, which facilitates the formation of the isolation pillars 11e.

Figure 10:
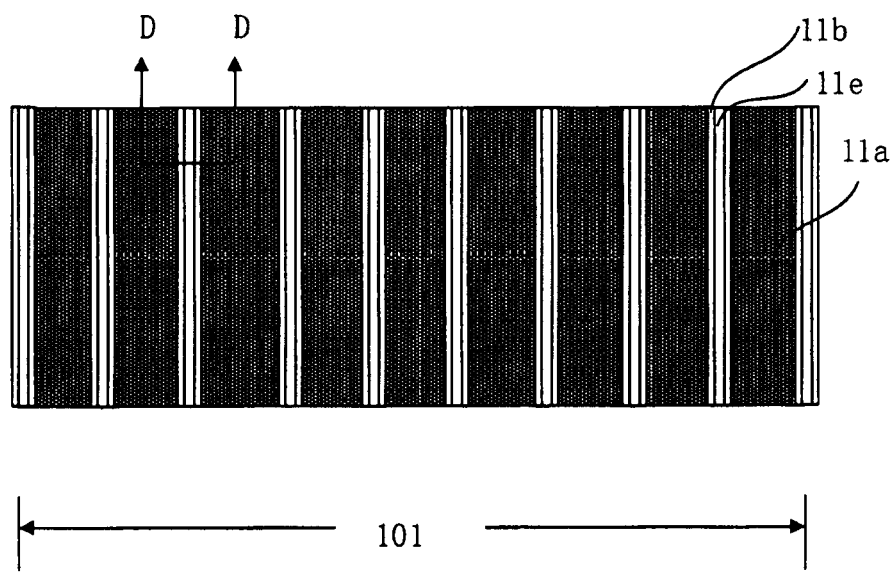
FIG. 10 is a schematic diagram of an intermediate structures corresponding to the flowchart in FIG. 3.
Figure 11:
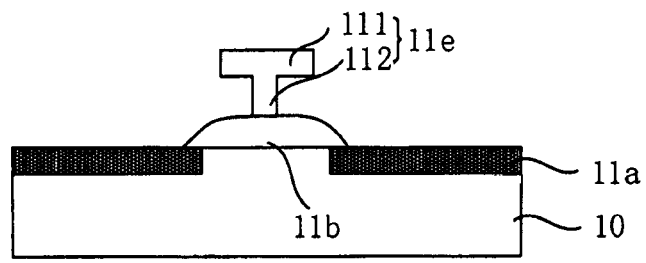
FIG. 11 is a schematic diagram of an intermediate structures corresponding to the flowchart in FIG. 3.

After that, referring to step S5 in FIG. 3 as well as FIGS. 10 and 11, the patterned sacrificial layer 01 is removed. FIG. 11 is a cross-sectional view taken along line DD in FIG. 10.

When the material of the sacrificial layer 01 is ITO and/or IGZO, oxalic acid is used for removal of the sacrificial layer 01. Although the material of the first electrodes 11a is also ITO, the ITO of the first electrodes 11a has been subjected to high temperature annealing treatment. Oxalic acid can only corrode ITO that has not been subjected to high temperature annealing treatment, but cannot corrode ITO that has been subjected to high temperature annealing treatment. Therefore, when removing the sacrificial layer 01, the performance of the first electrodes 11a is not affected.

When the material of the sacrificial layer 01 is metallic molybdenum, the sacrificial layer 01 is removed with a mixture of nitric acid, acetic acid, and phosphoric acid.

In the above two cases, the isolation pillars 11e can be made of organic transparent material.

When the material of the sacrificial layer 01 is an organic photosensitive material, the sacrificial layer 01 is removed by an ashing method. At this time, the isolation pillars 11e may be made of an inorganic transparent material.

Then, referring to step S6 in FIG. 3 as well as FIGS. 1 and 2(a), light-emitting material layers are formed on exposed pixel electrodes, and the light-emitting material layers include first light-emitting material layers 11c formed on exposed first electrodes 11a.

The first light-emitting material layers 11c may be OLED layers, which are formed by a vapor-deposition method. In an optional embodiment, a mask for vapor-deposition has a plurality of openings, and each opening is corresponding to one first electrode 11a. In another optional embodiment, the mask for vapor-deposition has an opening corresponding to the transparent display region 1a, and the first light-emitting material layers 11cs disposed on the first electrodes 11a are formed by partition of the T-shaped isolation pillars 11e.

A plurality of first sub-pixels 11 can form a first pixel unit. The first light-emitting material layers 11c of each first pixel unit may include red, green, and blue. In other optional embodiments, the first light-emitting material layers 11c of each first pixel unit may include red, green, blue, and yellow, which is not limited in this application.

Then, referring to step S7 in FIG. 3 as well as FIG. 2(a), a conductive material layer is in vapor-deposition, and the conductive material layer after vapor-deposition includes the second electrodes 11d formed by partition of the T-shaped isolation pillars 11e. The conductive material layer 110 is corresponding to the transparent display region 1a.

The mask for vapor-deposition of the second electrodes 11d has an opening corresponding to the transparent display region 1a.

In the above step S3, rectangular, regular trapezoidal or inverted trapezoidal filling-openings 01a can be formed through process adjustment. In step S4, rectangular support portions 112, regular trapezoidal support portions 112' or inverted trapezoidal support portions 112" are formed correspondingly.

It can be seen that in step S4, the T-shaped isolation pillars 11e are integrally formed, that is, the T-shaped isolation pillars 11e is a single-layer structure. The partition portions 111 and the support portions 112 are made of the same material, and are patterned in a same process. Therefore, the partition portions 111 and the support portions 112 have no delamination phenomenon and has a reliable performance.

Figure 12:
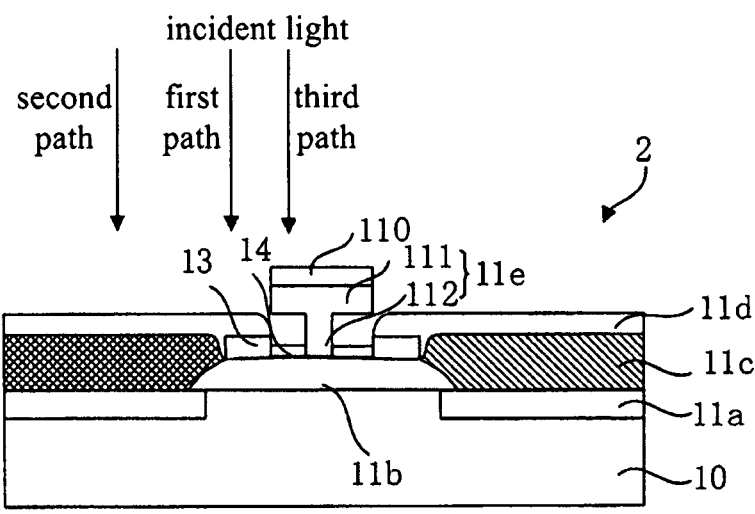
FIG. 12 is a schematic diagram of a cross-sectional structure of the display substrate corresponding to the transparent display region and having a first optical path compensation layer and a second optical path compensation layer on the basis of FIGS. 1 to 2(c) of the present application.

Referring to FIG. 12, the display substrate 2 in this embodiment has substantially the same structure as the display substrate 1 in FIGS. 1 to 2(c), except that the first pixel-defining layer 11b is also provided with a first optical path compensation layer 13 and a second optical path compensation layer 14. The first optical path compensation layer 13 is disposed below the partition portion 111 and does not overlap with an orthographic projection of the T-shaped isolation pillar 11e on the first pixel-defining layer 11b, and the second optical path compensation layer 14 is disposed below the partition portion 111 and within an orthographic projection of the partition portion 111 on the first pixel-defining layer 11b.

By changing a thickness and/or a refractive index of the first optical path compensation layer 13, an optical path difference $\Delta L_1$ between a first vertical incidence path passing through the first optical path compensation layer 13 and a second vertical incidence path passing through the first light-emitting material layer 11c satisfies: $(m-\delta_1)\lambda \leq |\Delta L_1| \leq (m+\delta_1)\lambda$, where $\lambda$ is a wavelength of visible light, m is a natural number; and $\delta_1$ is a constant between 0 and 0.2. By changing a thickness and/or a refractive index of the second optical path compensation layer 14, an optical path difference $\Delta L_2$ between a third vertical incidence path passing through the second optical path compensation layer 14 and a second vertical incidence path passing through the first light-emitting material layer 11c satisfies: $(n-\delta_2)\lambda \leq |\Delta L_2| \leq (n+\delta_2)\lambda$, where $\lambda$ is a wavelength of visible light, n is a natural number; and $\delta_2$ is a constant between 0 and 0.2. The visible light has a wavelength of 380 nm to 780 nm. When adjusting the optical path of each path, the parameter $\lambda$ can select monochromatic light with a fixed wavelength, such as green light which is more sensitive to human eye. In addition, the parameters m and n in the above equations may be same, and $\delta_1$ and $\delta_2$ may be same.

The vertical incident path means that the external incident light enters the display substrate in a direction perpendicular to the surface of the light-transmitting base until the light exits. A path of the external incident light (visible light) entering the display substrate 2 in a direction perpendicular to the surface of the light-transmitting base and passing through the display substrate along a thickness direction via the first optical path compensation layer 13 is a first vertical incident path. A path of the external incident light entering the display substrate 2 in a direction perpendicular to the surface of the light-transmitting base and passing through the display substrate along a thickness direction via the first light-emitting material layer 11c is a second vertical incident path. A path of the external incident light entering the display substrate 2 in a direction perpendicular to the surface of the light-transmitting base and passing through the display substrate along a thickness direction via the second optical path compensation layer 14 is a third vertical incident path.

An optical path difference $\Delta L_1$ between the first vertical incident path and the second vertical incident path passing through the display substrate, and an optical path difference $\Delta L_2$ between the third vertical incident path and the second vertical incident path passing through the display substrate are both sufficiently small. For example, the optical path difference $\Delta L_1$ can be made equal to zero by adjusting the values of parameters m and $\delta_1$, while the optical path difference $\Delta L_2$ can be made equal to zero by adjusting the values of parameters n and $\delta_2$. Moreover, since the optical path difference is proportional to the phase difference, light of the same phase after passing through the display substrate by two paths (for example, the first vertical incident path and the second vertical incident path with a sufficiently small optical path difference) still have the same phase, and no phase difference will occur. Since the diffraction phenomenon caused by the phase difference is eliminated, the clarity of the image perceived by the camera below the display substrate can be improved, and the photosensitive element below the display substrate can obtain clear and true images.

In an embodiment, the materials of the first optical path compensation layer 13 and the second optical path compensation layer 14 may be different, and a refractive index of the second optical path compensation layer 14 is smaller than a refractive index of the first optical path compensation layer 13. For example, the material of the first optical path compensation layer 13 is silicon nitride, and the material of the second optical path compensation layer 14 is silicon dioxide. In addition, the materials of the first optical path compensation layer 13 and the second optical path compensation layer 14 may also be the same, and the thickness of the second optical path compensation layer 14 is smaller than the thickness of the first optical path compensation layer 13. For example, the materials of the first optical path compensation layer 13 and the second optical path compensation layer 14 are silicon dioxide, or the materials of the first optical path compensation layer 13 and the second optical path compensation layer 14 are silicon nitride.

When the display substrate 2 is displaying, the first optical path compensation layer 13 and the second optical path compensation layer 14 can alleviate diffraction problems caused by external light and the image quality of full-screen display can be improved.

In use, the first optical path compensation layer 13 and the second optical path compensation layer 14 can be used alternatively.

Figure 13:
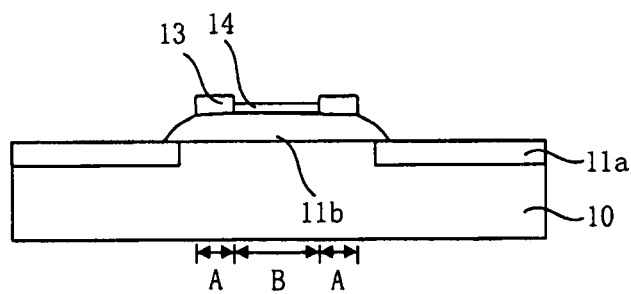
FIG. 13 is a schematic diagram of the intermediate structure formed in the manufacturing method of the display substrate in FIG. 12 of the present application.

The manufacturing method of the display substrate 2 is substantially the same as the manufacturing method in FIG. 3, except that: before step S3, that is, before the sacrificial layer 01 is formed, referring to FIGS. 13 and 12, a first optical path compensation layer 13 is formed in a first predetermined region A of the first pixel-defining layer 11b, and a second optical path compensation layer 14 is formed in a second predetermined region B. The first predetermined region A does not overlap with an orthographic projection of the T-shaped isolation pillar 11e to be formed on the first pixel-defining layer 11b, and the second predetermined region B is same as an orthographic projection of the T-shaped isolation pillar 11e to be formed on the first pixel-defining layer 11b.

As described above, the first optical path compensation layer 13 makes the optical path difference between the first vertical incidence path passing through the first optical path compensation layer 13 and the second vertical incidence path passing through the first light-emitting material layer 11c satisfies: $(m-\delta_1)\lambda \leq |\Delta L_1| \leq (m+\delta_1)\lambda$, where $\lambda$ is a wavelength of visible light, m is a natural number; and $\delta_1$ is a constant between 0 and 0.2. The second optical path compensation layer 14 makes the optical path difference between the third vertical incidence path passing through the second optical path compensation layer 14 and the second vertical incidence path passing through the first light-emitting material layer 11c satisfies: $(n-\delta_2)\lambda \leq |\Delta L_2| \leq (n+\delta_2)\lambda$, where $\lambda$ is a wavelength of visible light, n is a natural number; and $\delta_2$ is a constant between 0 and 0.2.

That an orthographic projection of the first optical path compensation layer 13 on the first pixel-defining layer 11b does not overlap with an orthographic projection of the T-shaped isolation pillar 11e on the first pixel-defining layer 11b means that the sum of the area of the orthographic projection of the first optical path compensation layer 13 on the first pixel-defining layer 11b and the area of the T-shaped isolation pillar 11e on the first pixel-defining layer 11b is smaller than or equal to the area of the first pixel-defining layer 11b, in other words, there is a blank space between the orthographic projection of the first optical path compensation layer 13 on the first pixel-defining layer 11b and the orthographic projection of the T-shaped isolation pillar 11e on the first pixel-defining layer 11b, or just no blank space.

The optical path difference $\Delta L_1$ between the first vertical incident path and the second vertical incident path, and the optical path difference $\Delta L_2$ between the third vertical incident path and the second vertical incident path are both sufficiently small so that light of the same phase after passing through the display substrate by two paths still have the same phase, and no phase difference will occur.

In step S3, when the sacrificial layer 01 is patterned to form a plurality of filling-openings 01a, the second optical path compensation layer 14 is patterned together with the sacrificial layer 01.

The first optical path compensation layer 13 formed in the first predetermined region A and the second optical path compensation layer 14 formed in the second predetermined region B can be patterned by photo etching or dry etching after depositing materials on the entire surface.

In addition, in other embodiments, the first optical path compensation layer 13 may be formed by depositing a material layer on the entire surface after removing the patterned sacrificial layer in step S5. The material layer is separated by T-shaped isolation pillars 11e, the material layer is partly disposed on the first pixel-defining layer 11b, partly disposed on the T-shaped isolation pillars 11e, and partly disposed on the first electrodes 11a exposed by the openings. Afterwards, the material layer on the T-shaped isolation pillars 11e and the first electrodes 11a is removed by dry etching with a patterned mask, and the material layer remaining on the first pixel-defining layer 11b forms the first optical path compensation layer 13.

In an embodiment, a refractive index of the material of the first optical path compensation layer 13 is greater than that of the material of the second optical path compensation layer 14. In an embodiment, when the material of the first optical path compensation layer 13 and the material of the second optical path compensation layer 14 are the same, a thickness of the first optical path compensation layer 13 is greater than a thickness of the second optical path compensation layer 14. The material of the first optical path compensation layer 13 may be silicon dioxide or silicon nitride, and the material of the second optical path compensation layer 14 may be silicon dioxide or silicon nitride.

In some embodiments, the first optical path compensation layer 13 and the second optical path compensation layer 14 can be formed alternatively.

Figure 14:
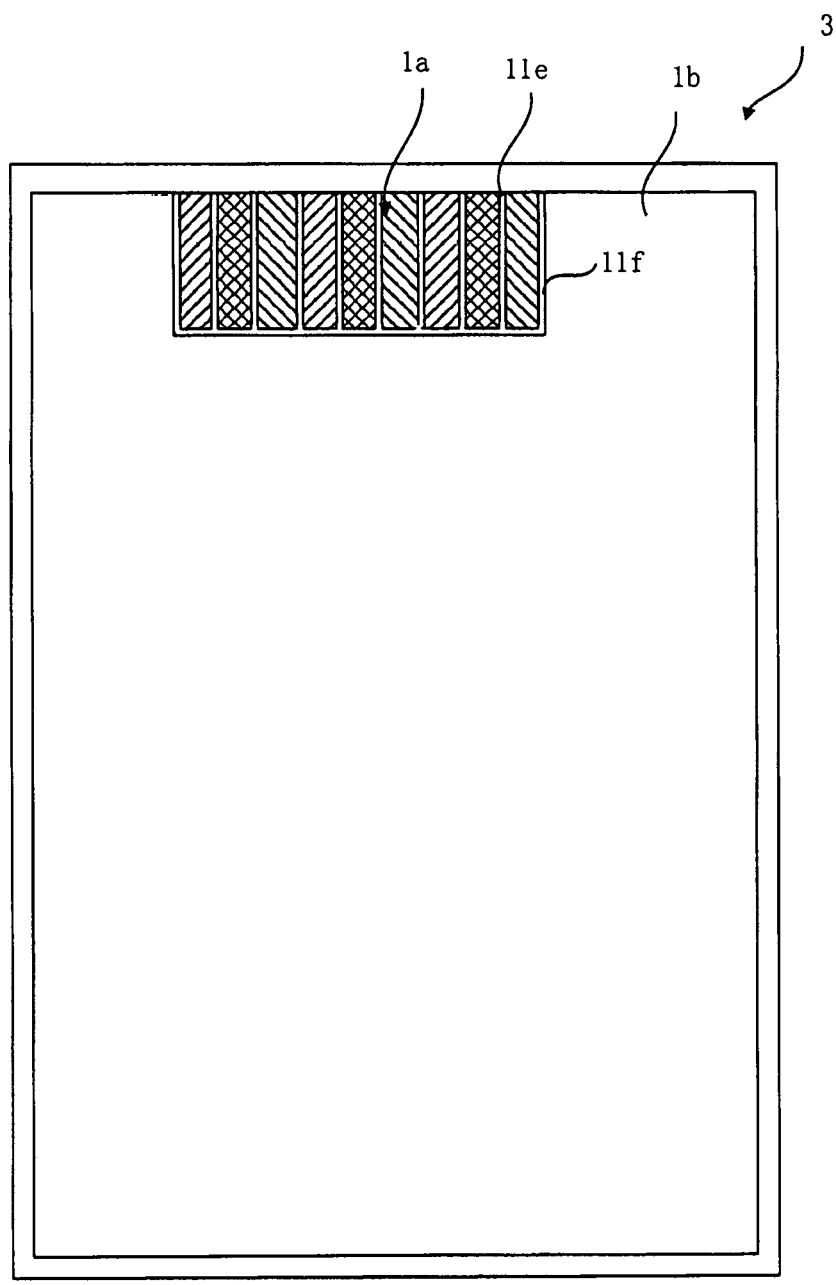
FIG. 14 is a top view of a display substrate including a non-transparent display region that at least partially surrounds the transparent display region in an embodiment of the present application.

Referring to FIG. 14, the structure of the display substrate 3 in this embodiment is substantially the same as the display substrate 1 in FIGS. 1 to 2(c) and the display substrate 2 in FIG. 12, except that: the display substrate 3 further includes a non-transparent display region 1b at least partially surrounding the transparent display region 1a.

Figure 15:
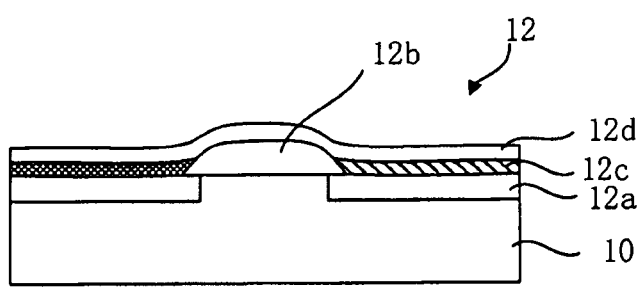
FIG. 15 is a schematic diagram of a cross-sectional structure of the non-transparent display region in FIG. 14.

Referring to FIGS. 14 and 15, the non-transparent display region 1b may include: a second base 15 and a plurality of second sub-pixels 12 on the second base 15. Each of the second sub-pixels 12 includes a third electrode 12a, a second pixel-defining layer 12b disposed on the third electrode 12a, a second light-emitting material layer 12c in an opening of the second pixel-defining layer 12b, and a fourth electrode 12d disposed on the second light-emitting material layer 12c.

The third electrode 12a may be an anode made of a reflective material. The fourth electrode 12d may be a cathode. The second light-emitting material layer 12c may be an OLED layer.

A plurality of second sub-pixels 12 may form a second pixel unit. The second light-emitting material layers 12c of each second pixel unit may include red, green, and blue. In other optional embodiments, the second light-emitting material layers 12c of each second pixel unit may also include four primary colors of red, green, blue, and yellow, which is not limited in this application.

The second sub-pixels may be driven by AM driving mode or PM driving mode. When driven by AM driving mode, the third electrodes 12a are block electrodes. When driven by PM driving mode, the third electrodes 12a are strip-shaped electrodes extending in a row (or column) direction, correspondingly, the fourth electrodes 12d are also strip-shaped electrodes extending in a column (or row) direction, and an intersection of the row and the column is provided with a second sub-pixel 12.

When driven by AM driving mode, the fourth electrodes 12d may be a planar electrode to simplify a pattern structure of the fourth electrodes 12d and improve the light transmittance.

In an optional embodiment, as shown in FIG. 14, a part of the transparent display region 1a close to the non-transparent display region is provided with an isolation belt 11f. A longitudinal section of the isolation belt 11f is T-shaped, and the T-shaped isolation belt 11f is an integrally formed structure configured to separate the second electrodes 11d and the fourth electrodes 12d when the conductive material layer is in vapor-deposition. With the above embodiment, the pattern of the opening of the mask for vapor-deposition of the second electrodes 11d and the fourth electrodes 12d can be simplified.

The isolation belt 11f may include a plurality of isolation pillars 11e connected together, and a size of the longitudinal section of the isolation belt 11f along the direction perpendicular to its extending direction is the same as a size of the longitudinal section of the isolation pillar 11e, where the longitudinal section of the isolation pillar is in the same direction as the longitudinal section of the isolation belt 11e. The size of the longitudinal section of the isolation belt 11f may be different from the size of the longitudinal section of the isolation pillar 11e, and the isolation belt and isolation pillars can be manufactured in a same process or separately.

In addition, when the non-transparent display region 1b completely surrounds the transparent display region 1a, the isolation belt 11f is a closed loop; when the non-transparent display region 1b partially surrounds the transparent display region 1a, the isolation belt 11f is a non-closed loop, as shown in FIG. 14.

In other optional embodiments, the partition between the second electrodes 11d and the fourth electrodes 12d can be achieved by the pattern of the opening of the mask for vapor deposition of the second electrodes 11d and the fourth electrodes 12d.

In the manufacturing process, on the basis of the display substrate 1, 2, or 3, an encapsulation layer, a polarizer, and a cover plate can be successively manufactured to form a display panel.

In an optional embodiment, the encapsulation layer can be a three-layer structure of an inorganic layer, an organic layer, and an inorganic layer.

For the display substrate 3, the transparent display region 1a and the non-transparent display region 1b are encapsulated in the same process.

The polarizer may be only arranged in the non-transparent display region 1b.

Based on the above display panel, an embodiment of the present application also provides a display device.

The display device may be a mobile phone, a tablet computer, a vehicle display screen, and the like.

The display device includes: a device body with a component region; and the above-mentioned display panel covering the device body; wherein the component region is disposed under the transparent display region 1a of the display panel, and a photosensitive component that emits or collects light through the transparent display region 1a is arranged in the component region.

The photosensitive component can include a camera and/or a light sensor. The light sensor includes an iris recognition sensor and/or a fingerprint recognition sensor.

Although this application is disclosed as above, this application is not limited thereto. Any person skilled in the art can make various changes and amendments without departing from the spirit and scope of this application. Therefore, the protection scope of this application should be based on the scope defined in the claims.

The invention claimed is:

1. A display substrate, comprising a display region, the display region comprising a transparent display region, and the transparent display region comprising:
   a first base which is a light-transmitting base; and
   a plurality of first sub-pixels disposed on the first base, each of the plurality of first sub-pixels comprising:
      a first electrode;
      a first pixel-defining layer disposed on the first electrode, and the first pixel-defining layer being provided with an opening;
      a first light-emitting material layer disposed in the opening of the first pixel-defining layer; and
      a second electrode disposed on the first light-emitting material layer;
   wherein a plurality of isolation pillars are provided on the first pixel-defining layer and the plurality of isolation pillars are configured to separate the second electrodes of adjacent first sub-pixels, and each isolation pillar in the plurality of isolation pillars is T-shaped, and each isolation pillar in the plurality of isolation pillars is an integrally formed structure, wherein a first optical path compensation layer is provided on the first pixel defining layer,
   wherein a second optical path compensation layer is provided on the first pixel-defining layer,
   wherein each of the first optical path compensation layer and the second optical path compensation layer is formed from at least one of silicon dioxide and silicon nitride, and
   wherein each of the first optical path compensation layer and the second optical path compensation layer is disposed in a layer that is above the first electrode and below the second electrode.

2. The display substrate according to claim 1, wherein the first sub-pixels are driven by passive matrix (PM) driving mode,
   the plurality of first electrodes are arranged in one row with a plurality of columns, and the plurality of isolation pillars are arranged in one row with a plurality of columns; or
   the plurality of first electrodes are arranged in one column with a plurality of rows, and the plurality of isolation pillars are arranged in one column with a plurality of rows.

3. The display substrate according to claim 1, wherein
   each isolation pillar in the plurality of isolation pillars comprises a partition portion and a support portion disposed on the first pixel-defining layer and configured to support the partition portion, and the partition portion comprises at least one partition end, and the minimum distance between the partition end and the support portion is greater than 1 μm, and/or a height of the support portion is greater than 550 nm.

4. The display substrate according to claim 3, wherein a longitudinal section of the support portion is rectangular, regular trapezoid or inverted trapezoid.

5. The display substrate according to claim 1, wherein the isolation pillar is made of an inorganic transparent material or an organic transparent material.

6. The display substrate according to claim 1,
wherein the isolation pillar comprises a partition portion and a support portion provided on the first pixel-defining layer and configured to support the partition portion, and
wherein the first optical path compensation layer is disposed below the partition portion, and an orthographic projection of the first optical path compensation layer on the first pixel-defining layer does not overlap with an orthographic projection of the isolation pillar on the first pixel-defining layer; and the first optical path compensation layer is configured to make an optical path difference $\Delta L_1$ between a first vertical incident path passing through the first optical path compensation layer and a second vertical incident path passing through the first light-emitting material layer satisfy: $(m-\delta_1)\lambda \le |\Delta L_1| \le (m+\delta_1)\lambda$, where $\lambda$ is a wavelength of visible light, m is a natural number; and $\delta_1$ is a constant between 0 and 0.2; and/or
wherein the second optical path compensation layer is disposed below the partition portion, and an orthographic projection of the second optical path compensation layer on the first pixel-defining layer is within an orthographic projection of the partition portion on the first pixel-defining layer; and the second optical path compensation layer is configured to make an optical path difference $\Delta L_2$ between a third vertical incidence path passing through the second optical path compensation layer and the second vertical incidence path passing through the first light-emitting material layer satisfy: $(n-\delta_2)\lambda \le |\Delta L_2| \le (n+\delta_2)\lambda$, where $\lambda$ is a wavelength of visible light, n is a natural number; and $\delta_2$ is a constant between 0 and 0.2.

7. The display substrate according to claim 6, wherein
when the first optical path compensation layer and the second optical path compensation layer are provided on the first pixel-defining layer,
a refractive index of a material of the first optical path compensation layer is greater than a refractive index of a material of the second optical path compensation layer; or
the first optical path compensation layer and the second optical path compensation layer are made of a same material, and a thickness of the first optical path compensation layer is greater than a thickness of the second optical path compensation layer.

8. The display substrate according to claim 1, wherein the display region further comprises a non-transparent display region at least partially surrounding the transparent display region, the non-transparent display region comprising:
a second base; and
a plurality of second sub-pixels disposed on the second base, each of the plurality of second sub-pixels comprising:
a third electrode;
a second pixel-defining layer disposed on the third electrode;
a second light-emitting material layer disposed in an opening of the second pixel-defining layer; and
a fourth electrode disposed on the second light-emitting material layer.

9. The display substrate according to claim 8, wherein the second sub-pixels are driven by active matrix (AM) driving mode, and the third electrodes of the plurality of second sub-pixels are block structures; and/or the fourth electrodes of the plurality of second sub-pixels are a planar electrode.

10. The display substrate according to claim 8, wherein an isolation belt is provided in a part of the transparent display region close to the non-transparent display region and configured to separate the second electrodes and the fourth electrodes; and a longitudinal section of the isolation belt is T-shaped, and the isolation belt is an integrally formed structure.

11. The display substrate according to claim 10, wherein the isolation belt comprises a plurality of isolation pillars connected together.

12. The display substrate according to claim 8, wherein
the non-transparent display region completely surrounds the transparent display region, and the isolation belt is a closed loop; or
the non-transparent display region partially surrounds the transparent display region, and the isolation belt is a non-closed loop.

13. The display substrate according to claim 11, wherein a size of the longitudinal section of the isolation belt along a direction perpendicular to an extending direction thereof is the same as a size of the longitudinal section of each of the plurality of isolation pillars.

14. A display device, comprising:
a device body with a component region; and
a display panel covering the device body; the display panel comprising a display substrate according to claim 1,
wherein the component region is disposed below a transparent display region of the display panel, and a photosensitive component that emits or collects light through the transparent display region is arranged in the component region.

* * * * *